United States Patent
Harada (10) Patent No.: US 8,481,349 B2
(45) Date of Patent: Jul. 9, 2013

(54) METHOD FOR MANUFACTURING SEMICONDUCTOR LIGHT EMITTING DEVICE

(75) Inventor: Mitsunori Harada, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 776 days.

(21) Appl. No.: 12/115,906

(22) Filed: May 6, 2008

(65) Prior Publication Data

US 2008/0213928 A1    Sep. 4, 2008

Related U.S. Application Data

(62) Division of application No. 11/242,061, filed on Oct. 4, 2005, now Pat. No. 7,371,593.

(30) Foreign Application Priority Data

Oct. 4, 2004   (JP) .................................. 2004-291278

(51) Int. Cl.
 *H01L 21/00*   (2006.01)
(52) U.S. Cl.
 USPC ........... 438/26; 438/29; 438/35; 257/E21.502
(58) Field of Classification Search
 USPC .................. 438/22, 26–29, 35; 257/E21.502
 See application file for complete search history.

(56) References Cited

U.S. PATENT DOCUMENTS

| | | | |
|---|---|---|---|
| 6,066,861 A | 5/2000 | Hohn et al. | |
| 6,245,259 B1 | 6/2001 | Hohn et al. | |
| 6,277,301 B1 | 8/2001 | Hohn et al. | |
| 6,576,930 B2 | 6/2003 | Reeh et al. | |
| 6,592,780 B2 | 7/2003 | Hohn et al. | |
| 6,613,247 B1 | 9/2003 | Hohn et al. | |
| 6,669,866 B1 | 12/2003 | Kummer et al. | |
| 6,774,401 B2 * | 8/2004 | Nakada et al. | 257/82 |
| 6,809,342 B2 | 10/2004 | Harada | |

(Continued)

FOREIGN PATENT DOCUMENTS

| | | |
|---|---|---|
| JP | 10-190065 | 7/1998 |
| JP | 2001-127346 | 5/2001 |
| JP | 2001-196639 | 7/2001 |
| JP | 2001-210872 | 8/2001 |

(Continued)

*Primary Examiner* — Jack Chen (74) *Attorney, Agent, or Firm* — Kenealy Vaidya LLP (57) ABSTRACT

A method for manufacturing a semiconductor light emitting device can result in a device that includes a housing having a cavity, a light emitting element on a bottom face of the cavity, and a wavelength conversion layer provided within the cavity. The wavelength conversion layer can include particles of a wavelength conversion material. The method includes forming the wavelength conversion layer within the cavity, which can include applying and hardening a first material to form a first wavelength conversion layer on the light emitting element, and applying and hardening a second material to substantially fill the remainder of the entire cavity, thereby forming a second wavelength conversion layer. The semiconductor light emitting device manufactured by the inventive method can achieve uniform light emitting characteristics without substantially any uneven color and can include high heat dissipation efficiency.

13 Claims, 5 Drawing Sheets

U.S. PATENT DOCUMENTS

| | | |
|---|---|---|
| 6,812,500 B2 | 11/2004 | Reeh et al. |
| 7,250,715 B2 | 7/2007 | Mueller et al. |
| 2003/0214233 A1 | 11/2003 | Takahashi et al. |
| 2004/0159846 A1 | 8/2004 | Doxsee et al. |
| 2005/0224818 A1 | 10/2005 | Harada |
| 2006/0022582 A1 | 2/2006 | Radkov |
| 2006/0065906 A1 | 3/2006 | Harada |
| 2006/0138938 A1 | 6/2006 | Tan et al. |

FOREIGN PATENT DOCUMENTS

| | | |
|---|---|---|
| JP | 2001-345483 | 12/2001 |
| JP | 2004-056075 | 2/2004 |
| JP | 2004-111882 | 4/2004 |

* cited by examiner

METHOD FOR MANUFACTURING SEMICONDUCTOR LIGHT EMITTING DEVICE

This application is a divisional application claiming priority under 35 U.S.C. §120 to U.S. patent application Ser. No. 11/242,061, filed Oct. 4, 2005 now U.S. Pat. No. 7,371,593, and which claims the priority benefit under 35 U.S.C. §119 of Japanese Patent Application No. 2004-291278 filed on Oct. 4, 2004, which are hereby incorporated in their entireties by reference.

BACKGROUND OF THE DISCLOSED SUBJECT MATTER

1. Field

The disclosed subject matter relates to a method for manufacturing a semiconductor light emitting device. In particular, the disclosed subject matter relates to a method for manufacturing a semiconductor light emitting device that emits light from a light emitting element through a wavelength conversion layer, mixes the excitation light that is emitted from the light emitting element with wavelength-converted light from the wavelength conversion layer, and then emits the mixed light to the outside.

2. Description of the Related Art

Figure 1:
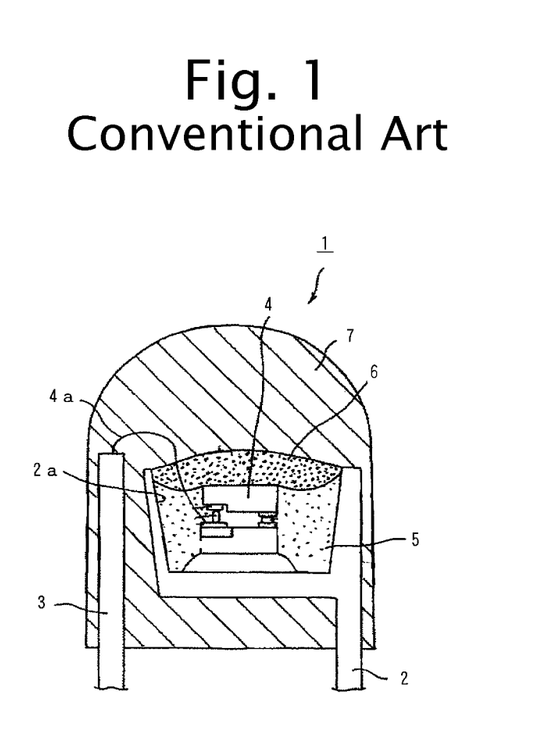
FIG. 1 is a schematic cross-sectional view showing a manufacturing step according to one conventional example of an LED manufacturing method.

Japanese Patent Laid-Open Publication No. 2004-111882 discloses an example of a conventional LED used as a wavelength conversion type semiconductor light emitting device, which is shown in FIG. 1.

Namely, according to the disclosure in Japanese Patent Laid-Open Publication No. 2004-111882, an LED 1 includes two lead frames 2 and 3, an LED chip 4, a first resin layer 5, a second resin layer 6, and a resin mold 7. The LED chip 4 is positioned on the bottom face of a cavity 2a formed on the upper end of the lead frame 2. The first resin layer 5 is filled inside the cavity 2a up to the upper surface of the LED chip 4. The second resin layer 6 is filled over the first resin layer 5. The resin mold 7 is formed so as to enclose both the upper ends of the lead frames 2 and 3.

The LED chip 4 can be a blue LED chip, for example. The LED chip 4 is placed onto and then die bonded to the bottom face of the cavity 2a (lead frame 2). The chip 4 is wire bonded to the other lead frame 3 using a wire 4a, such as a gold wire. Thereby, the chip 4 is electrically connected to both the lead frames 2 and 3.

The first resin layer 5 and the second resin layer 6 are prepared by mixing an optically transparent resin with particles of a fluorescent material, which act as a wavelength conversion material. Further, the concentration of the fluorescent material in the first resin layer 5 is set to become lower than the concentration of the fluorescent material in the second resin layer 6.

Further, the concentration of the fluorescent material of the first resin layer 5 and the second resin layer 6 is distributed such that the product between the optical path length for light from the LED chip 4 that reaches the upper surface of the second resin layer 6 and the concentration of the fluorescent material is almost constant.

According to this type of LED configuration, when light emitted from the LED chip 4 in each direction passes through the first and second resin layers 5 and 6, the light will pass through an optical path where an almost identical amount of fluorescent material exists. Consequently, uniform light emitting characteristics without any uneven color can be obtained on the upper surface of the second resin layer 6 by mixing the color of the light that has undergone wavelength conversion by the fluorescent material with the color of the original light that does not pass through the fluorescent material.

The following problems occurred in LEDs with this type of configuration. Namely, the optically transparent resin is mixed with the fluorescent material and hardened when forming the first and second resin layers 5, 6. It is a known fact that for this case, the heavier fluorescent particles will precipitate by gravity due to differences in the specific gravity of both layers. Because of this, the concentration of the fluorescent material within the resin cannot be made uniform in both the first and second resin layers 5 and 6.

Surface tension also occurs in the optically transparent resin between the cavity 2a and the LED chip 4. Because of this surface tension, it is difficult to make the surface shape of the first resin layer 5 uniform. Consequently, it is difficult to make the product between the optical path length and the concentration of the fluorescent material almost constant. This in turn makes it difficult to achieve uniform light emitting characteristics without any uneven color.

In addition to the LED chip 4 itself generating heat, the fluorescent material emits heat due to energy loss during wavelength conversion. The concentration of the fluorescent material after precipitation is not high, thereby resulting in inefficient and poor dissipation of heat from the fluorescent material through the LED chip 4 to the lead frame 2.

These problems not only exist in blue LED chips but similarly exist in LED chips which emit other light and semiconductor light emitting devices, such as LEDs, which emit a mixed color of light consisting of or including light from other light emitting elements and wavelength-converted light from a wavelength conversion material.

Further, these problems not only occur with LEDs of the type in which the lead frame, provided with a cavity, is insertion molded. For example, the same type of problems occur in semiconductor light emitting devices of the type in which a flat lead frame is insertion molded in a resin housing, a cavity is formed on the upper surface of the resin housing, and one portion of the lead frame is exposed to the bottom of the cavity. As another example, the problems also exist in semiconductor light emitting devices, such as LEDs, in which the cavity is formed on the upper surface of a semiconductor substrate. The LEDs are also provided with electrode layers composed of a conductive thin film that wraps around from the bottom face of this cavity up to the upper surface of the substrate through the sides of the cavity and, according to circumstances, down along the side surfaces of the substrates to the rear surface thereof.

SUMMARY

Taking into consideration the points mentioned above as well as other considerations, one of the aspects of the disclosed subject matter is providing a method for manufacturing a semiconductor light emitting device utilizing a simple configuration in which substantially no uneven color occurs in a mixed color of light consisting and/or including an excitation light from a light emitting element and wavelength-converted light produced by a wavelength conversion material. The resulting light emitting device should also provide for efficient and favorable dissipation of heat that is emitted as energy loss during wavelength conversion by the wavelength conversion material.

Another of the aspects of the disclosed subject matter is a method for manufacturing a semiconductor light emitting device including providing a housing having a cavity and a power feed line, a light emitting element electrically connected to the power feed line on a bottom face of the cavity, and a wavelength conversion layer provided within the cavity, the wavelength conversion layer containing particles of a wavelength conversion material. The method can include a step of forming the wavelength conversion layer within the cavity, and the wavelength conversion layer forming step can include: a first step of applying and hardening a first material to form a first wavelength conversion layer on the light emitting element; and a second step of applying and hardening a second material to fill the entire cavity, thereby forming a second wavelength conversion layer.

In the method for manufacturing a semiconductor light emitting device as described above, it is sometimes beneficial for the wavelength conversion layer forming step to further include, before the first step, a step of injecting a transparent resin spacer, that does not contain a wavelength conversion material, inside the cavity to an extent that slightly exposes an upper surface of the light emitting element, and hardening the transparent resin spacer. Here, the cavity can be formed to widen upwards.

In the method for manufacturing a semiconductor light emitting device as described above, the cavity may include a lower cavity and an upper cavity, wider than the lower cavity, positioned at a step portion that widens outward above the lower cavity. Furthermore, an outer peripheral edge of the transparent resin spacer may be positioned at the same height as the step portion.

In the method for manufacturing a semiconductor light emitting device as described above, the first wavelength conversion layer may have a higher concentration of wavelength conversion material than does the second wavelength conversion layer.

Another aspect of the disclosed subject matter is a method for manufacturing a semiconductor light emitting device including a housing having a cavity and a power feed line, a light emitting element electrically connected to the power feed line on a bottom face of the cavity, and a wavelength conversion layer provided within the cavity. The wavelength conversion layer can include particles of a wavelength conversion material. The cavity includes a lower cavity and an upper cavity, wider than the lower cavity, positioned at a step portion that widens outward above the lower cavity. Here, the method can include a step of forming the wavelength conversion layer within the cavity, and the wavelength conversion layer forming step can include: a first step of applying and hardening a second material to form a second wavelength conversion layer within the cavity such that an upper surface of the light emitting element is slightly exposed. A surface of the second wavelength conversion layer can be formed in a bowl shape while the surface rises up toward the periphery, and an outer peripheral edge of the surface of the second wavelength conversion layer can be positioned over the step portion. A second step of applying and hardening a first material can be used to substantially fill the remainder of the cavity, thereby forming a first wavelength conversion layer.

In the method for manufacturing a semiconductor light emitting device as described above, a slope of the bowl shape can be controlled based on the shape of the step portion when applying the second material for the second wavelength conversion layer.

Still another aspect of the disclosed subject matter is a method for manufacturing a semiconductor light emitting device including a housing having a cavity and a power feed line, a light emitting element electrically connected to the power feed line on a bottom face of the cavity, and a wavelength conversion layer provided within the cavity. The wavelength conversion layer can contain particles of a wavelength conversion material. The cavity can include a lower cavity that widens upwards and an upper cavity whose side wall is continued from an upper opening end of the lower cavity to extend vertically. Here, the method can include a step of forming the wavelength conversion layer within the cavity. The wavelength conversion layer forming step can include a first step of applying and hardening a second material to form a second wavelength conversion layer within the cavity such that: 1) a portion of an upper surface of the light emitting element is slightly exposed; 2) a surface of the second wavelength conversion layer is formed in a bowl shape while the surface rises up toward the periphery; and 3) an outer peripheral edge of the surface of the second wavelength conversion layer is positioned at the side wall of the upper cavity. Forming the wavelength conversion layer can also include a second step of applying and hardening a first material to substantially fill a remainder of the entire cavity, thereby forming a first wavelength conversion layer.

In the method for manufacturing a semiconductor light emitting device as described above, the first wavelength conversion layer may have a higher concentration of wavelength conversion material than does the second wavelength conversion layer.

In the method for manufacturing a semiconductor light emitting device as described above, a slope of the bowl shape can be controlled based on various shapes of the side walls of the lower cavity and the upper cavity when applying the second material for the second wavelength conversion layer.

In the method for manufacturing a semiconductor light emitting device as described above, the wavelength conversion material can be a fluorescent material.

In the method for manufacturing a semiconductor light emitting device as described above, the power feed line may be insertion molded within the housing. The power feed line may include a lead frame that is exposed on a bottom face of the cavity. Alternatively, the power feed line may include a lead frame that defines the cavity.

Alternatively, the power feed line may include an electrode layer formed of a conductive thin film on at least a portion of any one of a surface of the housing, a side wall of the cavity, and a bottom face of the cavity.

According to the first aspect described above, while forming the wavelength conversion layer, initially, a first material is applied inside the cavity and hardened to form the first wavelength conversion layer on the light emitting element, and then a second material is applied and hardened to fill substantially the remainder of the entire cavity, thereby forming the second wavelength conversion layer. When light is emitted upwards from the light emitting element, part of the light is wavelength converted by the first wavelength conversion layer, and part of the light is mixed with the wavelength-converted light. Then, the mixed color of light is emitted to the outside through the second wavelength conversion layer positioned over the first wavelength conversion layer.

Additionally, when light is emitted sideways from the light emitting element, part of the light is wavelength converted by the second wavelength conversion layer and part of the light is mixed with the wavelength-converted light. Then, the mixed color of light is emitted to the outside.

In this manner, substantially only the light that emits upwards from the light emitting element passes through the first wavelength conversion layer and is wavelength shifted by the wavelength conversion material contained in the first wavelength conversion layer at that time. Therefore, the generation of uneven color, such as a bluish color above the light emitting element, is controlled and uniform light emitting characteristics for the emitted light can be obtained with substantially no uneven color on the whole when, for example, blue light is emitted by suitably selecting the type and concentration of the wavelength conversion material in the first wavelength conversion layer and the second wavelength conversion layer.

Uneven color can be controlled to an even greater extent by suitably adjusting the concentrations of the wavelength conversion material of the first and second wavelength conversion layers in relationship to the light radiation characteristics of the light emitting element. As an example, the concentration of the wavelength conversion material of the first wavelength conversion layer can be made higher than the concentration of the wavelength conversion material of the second wavelength conversion layer.

The wavelength conversion material, such as a fluorescent material, precipitates by its own weight while the second wavelength conversion layer is hardened by heating. This also results in the fluorescent material depositing around the periphery of the light emitting element and the concentration increasing due to this deposit. When the concentration of the wavelength conversion material of the second wavelength conversion layer is lower than the concentration of the wavelength conversion material of the first wavelength conversion layer, the difference in the concentration will become small close to the boundary of both the wavelength conversion layers, thereby making it possible to reduce color differences of the mixed color of light.

The first wavelength conversion layer can be directly applied onto the upper surface of the light emitting element. Because of this, even if the particles of the wavelength conversion material generate heat due to energy loss during wavelength conversion when driving the semiconductor light emitting device, this heat will be dissipated from the light emitting element through the housing, thereby obtaining an efficient and favorable dissipation of heat.

Because this control of heat dissipation in the wavelength conversion material also achieves control of temperature increases of the light emitting element and, in turn, the semiconductor light emitting device, there may be substantially no reduction in the light emission efficiency due to temperature increases.

Take a case where a transparent resin spacer, that does not contain a wavelength conversion material, is injected and hardened inside the cavity to an extent that slightly exposes the upper surface of the light emitting element before the first wavelength conversion layer forming step. In this case, even if the wavelength conversion material of the second wavelength conversion layer precipitates by its own weight, the wavelength conversion material will not deposit close to the bottom face of the cavity but will deposit upwards away from the bottom face because of the transparent resin spacer that is located at the lower side of the cavity away from the upper surface of the light emitting element. Because of this, the light emitted from the side wall of the light emitting element can efficiently be incident to the wavelength conversion material of the second wavelength conversion layer.

When the cavity is formed such that it widens upwards, the excitation emission light that is emitted sideways from the light emitting element or the wavelength-converted light emitted sideways from the wavelength conversion material is incident to the side wall of the cavity and then reflected upwards. The light extraction efficiency can thus be improved.

We will consider when the cavity includes a lower cavity and an upper cavity that is wider than the lower cavity and positioned at a step portion that widens outward above the lower cavity. The outer peripheral edge of the transparent resin spacer can be positioned at the same height as the step portion. In this case, the upper surface of the transparent resin spacer creeps up the side wall of the cavity following the surface tension of the material that constitutes the transparent resin spacer, and based on the shape of the side wall provided with the step portion of the cavity. Consequently, the upper surface of the transparent resin spacer is formed in a bowl shape.

When the concentration of the wavelength conversion material in the first wavelength conversion layer is higher than the second wavelength conversion layer, the light emitted upwards from the light emitting element passes through the first wavelength conversion layer with the high concentration of wavelength conversion material. Thus, an even stronger wavelength conversion effect can be produced. For example, when a blue light emitting element is used, it is possible to inhibit the light that is emitted upwards from the element from becoming a bluish light. Thus, reductions in uneven color on the whole can be achieved.

According to the second and third aspects, while forming the wavelength conversion layer, initially, a second material is applied and hardened to form the second wavelength conversion layer such that a portion of the upper surface of the light emitting element is slightly exposed, and such that the surface of the second wavelength conversion layer is formed in a bowl shape with the surface rising up toward the periphery. Thereafter, a first material is applied and hardened to substantially fill a remainder of the entire cavity with the first wavelength conversion layer.

Because of this, the thickness of the first wavelength conversion layer gradually becomes thinner in the radial direction from the center towards the periphery, thereby providing a concentration gradient that decreases in the quantity of the wavelength conversion material.

Accordingly, the light that is emitted sideways from the light emitting element is wavelength-converted by the second wavelength conversion layer. Then, the wavelength-converted light and the light emitted directly from the light emitting element are emitted to the outside through the first wavelength conversion layer that is positioned over the second wavelength conversion layer.

In addition, the light that is emitted upwards from the light emitting element is wavelength-converted by the first wavelength conversion layer. Then, the wavelength-converted light and the light emitted directly from the light emitting element are emitted to the outside.

In this manner, substantially only the light that emits sideways from the light emitting element passes through both the second wavelength conversion layer and the first wavelength conversion layer, and the light that emits upwards from the light emitting element passes through substantially only the first wavelength conversion layer. Therefore, when, for example, a blue light emitting element is adopted, the generation of uneven color, such as the color becoming a bluish colored light at the light emitting element, can be controlled and uniform light emitting characteristics of the emitted light can be obtained without substantially any uneven color on the whole by suitably selecting the type and concentration of the wavelength conversion material in the first wavelength conversion layer and the second wavelength conversion layer.

Furthermore, according to the third aspect, the size of the opening of the lower cavity is the same as that of the upper cavity. This can prevent the wavelength-converted light from leaking from the outer periphery of the light emitting portion. In addition to this, the area of the light emitting portion can be reduced, thereby improving the light density as a whole.

When the concentration of the wavelength conversion material in the first wavelength conversion layer is higher than the second wavelength conversion layer, the light emitted upwards from the light emitting element passes through the first wavelength conversion layer with the high concentration of wavelength conversion material. An even stronger wavelength conversion effect can thus be produced. For example, when a blue light emitting element is used, it is possible to inhibit light that is emitted directly from becoming a bluish light, and it is also possible to obtain reductions in uneven color on the whole.

Now we will consider a case where the slope of the bowl shape is controlled based on the shape of the step portion when applying the second material to form the second wavelength conversion layer. In this case, when the second material for the second wavelength conversion layer is applied, the material creeps up the side wall of the cavity following the surface tension of the layer and the shape of the step portion of the cavity, namely, the shape of the side wall that is provided with a level difference. By suitably adjusting the shape of the step portion of the cavity, this amount of creeping, namely, the slope of the bowl shape can be controlled and a desired bowl shape can be obtained.

Take a case where the slope of the bowl shape is controlled based on the shapes of the side walls of the upper and lower cavities when applying the second material to form the second wavelength conversion layer. In this case, when the second material for the second wavelength conversion layer is applied, the material creeps up the side wall of the cavity following the surface tension of the layer and the shapes of the side walls of the upper and lower cavities. By suitably adjusting the shapes of the respective side walls of the cavity, this amount of creeping, namely, the slope of the bowl shape can be controlled and a desired bowl shape can be obtained.

If the emission light from the light emitting element is incident to the wavelength conversion material, when the wavelength conversion material is a fluorescent material, the wavelength conversion material will be excited and emit fluorescent light as wavelength-converted light.

Principles of the disclosed subject matter can be applied to a surface-mounted lead frame type semiconductor light emitting device when, for example, the power feed line to the light emitting element includes a lead frame insertion molded within the cavity as well as exposed on the bottom face of the cavity.

Principles of the disclosed subject matter can be applied to a shell-type lead frame semiconductor light emitting device when, for example, the power feed line to the light emitting element includes a lead frame insertion molded within the housing and which also defines the cavity.

Principles of the disclosed subject matter can be applied to a surface-mounted type semiconductor light emitting device that utilizes, for example, a semiconductor substrate when, for example, the power feed line to the light emitting element includes electrode layers formed of a conductive thin film on the surface of the substrate as well as on the side wall and the bottom face of the cavity.

In this manner, when filling the cavity with the optically transparent resin that contains wavelength conversion material, the first wavelength conversion layer with a high concentration of wavelength conversion material is positioned on the upper surface of the light emitting element and the second wavelength conversion layer that has a low concentration of wavelength conversion material is positioned close to the side of the light emitting element. Because of this, the concentration of the wavelength conversion material over the light emitting element becomes higher, thereby resulting in uniform light emitting characteristics substantially without uneven color. Furthermore, because the wavelength conversion material is deposited directly onto the light emitting element, heat that is generated due to energy loss during wavelength conversion by the wavelength conversion material can be efficiently dissipated from the housing through the light emitting element.

BRIEF DESCRIPTION OF THE DRAWINGS

These and other characteristics, benefits and advantages of the disclosed subject matter will become clear from the following description with reference to the accompanying drawings, wherein.

DETAILED DESCRIPTION OF EXEMPLARY EMBODIMENTS

In the following description exemplary embodiments of the disclosed subject matter will be described in detail with reference to FIG. 2 to FIG. 8.

The embodiments described below are concrete examples of the disclosed subject matter and, although there are some technical or beneficial features, the scope of the disclosed subject matter is not limited to these embodiments.

Figure 2:
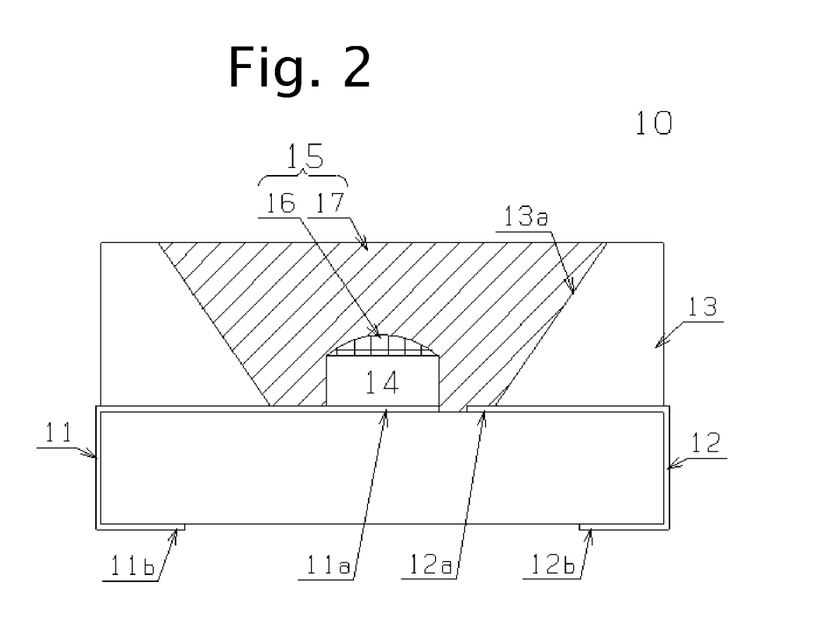
FIG. 2 is a schematic cross-sectional view showing the configuration of an embodiment of an LED manufactured by a manufacturing method according to principles of the disclosed subject matter.

FIG. 2 shows an embodiment of an LED that functions as a semiconductor light emitting device and is made according to principles of the disclosed subject matter.

In FIG. 2, the LED 10 includes: a pair of lead frames 11 and 12; a housing 13 integrally formed so as to maintain the lead frames 11 and 12 at a fixed position; a blue LED chip 14 mounted on a chip mounting portion 11a of one of the lead frames 11 that is exposed within a cavity 13a and provided on the upper surface of the housing 13; and a wavelength conversion layer 15 mixed with a wavelength conversion material (for example, a fluorescent material) and formed so as to enclose the blue LED chip 14 inside the cavity 13a of the housing 13.

The lead frames 11 and 12 can be formed from a conductive material such as aluminum. The lead frames 11 and 12 are provided with the chip mounting portion 11a and a bonding portion 12a, respectively, on respective ends exposed within the cavity 13a. The frames 11 and 12 may wrap around from the respective side walls of the housing 13 to the lower surface, and the other ends thereof can constitute connection portions 11b and 12b for surface mounting, respectively.

These lead frames 11 and 12 can be produced, for example, by press molding a metal plate into a predetermined shape. The housing 13 can be integrally formed with these lead frames 11 and 12 serving as inserts by an insertion molding process. The cavity 13a is provided at the center of the upper surface of the housing 13 while widening upwards in a bowl shape. The chip mounting portion 11a and the bonding portion 12a of the respective ends of the lead frames 11 and 12 are exposed on the bottom face of the cavity 13a.

The blue LED chip 14 is connected to the top of the chip mounting portion 11a of the lead frame 11 inside the cavity 13a of the housing 13 and includes an electrode provided on the chip surface. This electrode is electrically connected by a bonding wire (not shown) to the bonding portion 12a of the lead frame 12 disposed adjacent to the chip and exposed within the cavity 13a. The blue LED chip 14 can emit blue light when a drive voltage is applied thereto.

The wavelength conversion layer 15 can be composed of a first wavelength conversion layer 16 formed on the upper surface of the blue LED chip 14 and a second wavelength conversion layer 17 filled inside the cavity 13a on top of the layer 16.

These first and second wavelength conversion layers 16 and 17 can be formed of a first material and a second material, respectively. Each of the materials can be made of a high heat resistant thermosetting transparent resin, such as a transparent epoxy resin (as a base resin), mixed with minute particles of a wavelength conversion material (not shown). The wavelength conversion material precipitates downward by its own weight while the resin hardens.

Additionally, when the blue light from the blue LED chip 14 is incident to the first and second wavelength conversion layers 16 and 17, the wavelength conversion material is excited and emits a yellow light. The blue light from the LED chip 14 and the yellow light from the wavelength conversion material are mixed to produce a white light. This is then radiated outward.

The wavelength conversion material can, for example, use any of a YAG wavelength conversion material doped with an element such as cerium or gadolinium, a wavelength conversion material that substitutes the yttrium of this type of YAG wavelength conversion material with another element, an ortho-silicate based wavelength conversion material, and the like. In this embodiment the wavelength conversion material is set to emit a fluorescent yellow light upon excitation by blue light from the LED chip 14.

The first wavelength conversion layer 16 includes a comparatively high concentration of wavelength conversion material and the second wavelength conversion layer 17 includes a comparatively low concentration of wavelength conversion material.

The wavelength conversion layer 15 can be formed as follows. Namely, the blue LED chip 14 can be mounted on a chip mounting portion 11a of the lead frame 11 that is exposed to the inside of the cavity 13a of the substrate 13. In this state, initially, the first material for the first wavelength conversion layer 16 is applied onto the blue LED chip 14 inside the cavity 13a and then heated to be hardened. During this time, the viscosity of the material (for example, thermosetting transparent resin) that makes up the first wavelength conversion layer 16 is temporarily reduced by heating. Because of this, the wavelength conversion material precipitates by its own weight and deposits on the blue LED chip 14.

Next, the second material for the second wavelength conversion layer 17 is filled into the cavity 13a over the top of the first wavelength conversion layer 16 and then heated to be hardened. During this time, the viscosity of the second wavelength conversion layer 17 is temporarily reduced by heating and the particles of the wavelength conversion material contained within the second wavelength conversion layer 17 precipitate by their own weight and deposit at the bottom face of the cavity 13a around the periphery of the blue LED chip 14.

Because of this, even if heat is generated due to energy loss during wavelength conversion of the wavelength conversion material while driving the LED 10, this heat will be efficiently transmitted to the blue LED chip 14 and the housing 13 for dissipation. Consequently, the light emitting efficiency is not reduced due to a temperature rise in the blue LED chip 14 caused by the heat generated by the wavelength conversion material. This can provide a favorable light emitting efficiency.

The surface-mounted type white light LED 10 according to the above described embodiment of the disclosed subject matter can be configured so that the application of driving voltage to the blue LED chip 14 via the pair of the lead frames 11 and 12 can activate the blue LED chip 14 to emit blue light.

Then, part of the emitted blue light from the blue LED chip 14 is incident to the wavelength conversion material that is mixed in the wavelength conversion layer 15 to excite the wavelength conversion material. This results in an emission of yellow light. The yellow light is mixed with the blue light that is emitted directly from the blue LED chip 14 to produce white light to be emitted to the outside through the wavelength conversion layer 15.

The light emitted upwards from the blue LED chip 14 passes through the first wavelength conversion layer 16 and the second wavelength conversion layer 17 above the first wavelength conversion layer 16 and thus excites the high concentration of wavelength conversion material in the first wavelength conversion layer 16. This improves the wavelength conversion efficiency.

Because of this, the blue light from the blue LED chip 14 is adequately mixed with the wavelength-conversion light produced by the wavelength conversion material to produce a white light over the blue LED chip 14 which generally has a high light radiation concentration. This in turn makes it possible to inhibit the light from becoming bluish light.

Further, the wavelength conversion material naturally precipitates at the region over the blue LED chip 14 of the second wavelength conversion layer 17 during thermal hardening, which in turn makes the concentration of the wavelength conversion material very low therein.

In contrast to this, the light emitted sideways from the blue LED chip 14 passes through substantially only the second wavelength conversion layer 17. While the light passes through layer 17, the comparatively low concentration of wavelength conversion material contained in the second wavelength conversion layer 17 is excited and generates a yellow light as an excitation light. This yellow light is mixed with the blue light from the blue LED chip 14 thereby producing white light which is then emitted upwards.

Consequently, substantially only the light emitted upwards from the blue LED chip 14 passes through the first wavelength conversion layer 16 to excite the relatively high concentration of wavelength conversion material. This makes it possible to obtain uniform light emitting characteristics for the emitted light color (white) substantially without uneven color on the whole. In addition, the white light emitted upwards does not become bluish light over the blue LED chip 14.

According to the LED 10 in this embodiment of the disclosed subject matter, when forming the wavelength conversion layer 15 in this manner, initially, the first material for the first wavelength conversion layer 16 is applied and thermally hardened substantially only onto the blue LED chip 14. Thereafter, the second material for the second wavelength conversion layer 17 is filled inside the cavity 13a and heated such that it is hardened on top of the layer 16. On account of this action, substantially only the wavelength conversion layer with a high concentration of wavelength conversion material is formed on the blue LED chip 14. This makes it possible to obtain an almost uniform excitation intensity of the wavelength conversion material using the blue light from the blue LED chip 14. In addition, it is possible to obtain light emitting characteristics substantially without uneven color on the whole.

Figure 3:
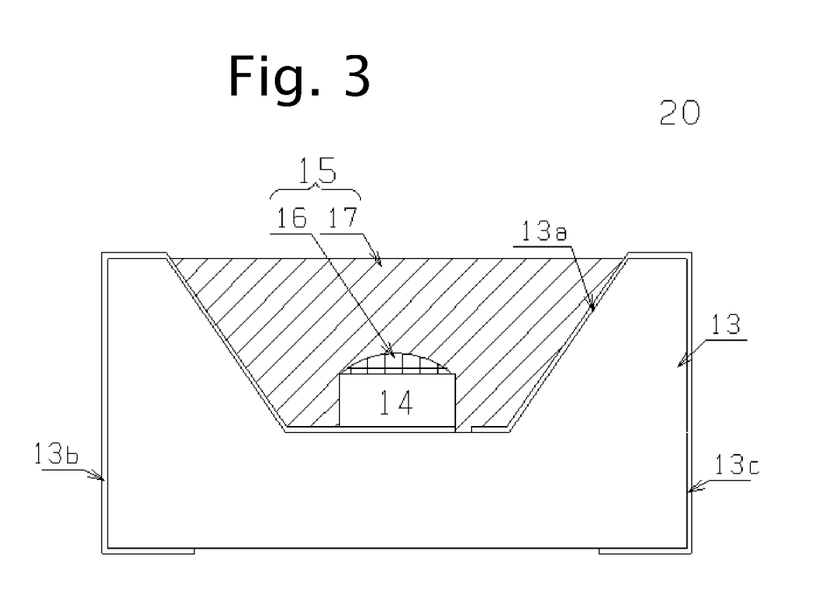
FIG. 3 is a schematic cross-sectional view showing the configuration of another embodiment of an LED manufactured by a manufacturing method according to principles of the disclosed subject matter.

FIG. 3 shows another embodiment of an LED used as a semiconductor light emitting device and made according to principles of the disclosed subject matter.

The LED 20 in FIG. 3 is an LED that does not use the lead frames 11 and 12 as used in the LED 10 shown in FIG. 2. Instead, LED 20 can be provided with electrode layers 13b and 13c. The electrode layers 13b and 13c are formed of a conductive thin film such as a metal, and extend from the bottom face of the cavity 13a of the housing 13 (a semiconductor substrate, for example) through a sloped side wall up to the upper surface of the housing 13.

The wavelength conversion layer 15 formed inside the cavity 13a is composed of a first wavelength conversion layer 16 and a second wavelength conversion layer 17 in a like manner as compared to the LED 10, and can also be formed in a similar manner as compared to that of LED 10.

As in the LED 10 show in FIG. 2, when forming the wavelength conversion layer 15 to constitute the LED 20, initially, the first material for the first wavelength conversion layer 16 is applied and heated to be hardened onto the blue LED chip 14. Thereafter, the second material for the second wavelength conversion layer 17 is filled and heated to be hardened inside the cavity 13a on top of the layer 16.

Because of this, the first wavelength conversion layer 16, with a high concentration of the wavelength conversion material, is formed on the blue LED chip 14, making it possible to obtain an almost uniform excitation intensity of the wavelength conversion material using the blue light from the blue LED chip 14. In addition, light emitting characteristics without any uneven color on the whole can be obtained.

Figure 4:
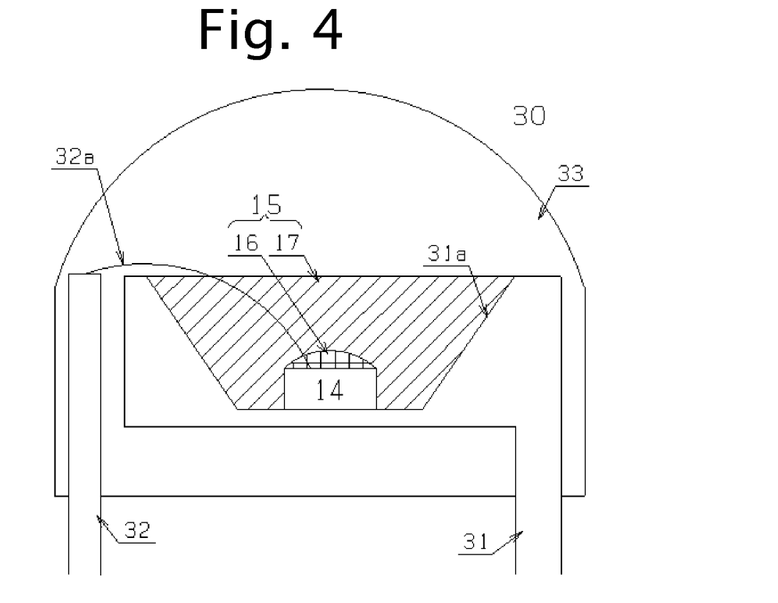
FIG. 4 is a schematic cross-sectional view showing the configuration of another embodiment of an LED manufactured by a manufacturing method according to principles of the disclosed subject matter.

FIG. 4 shows another embodiment of an LED used as a semiconductor light emitting device made according to principles of the disclosed subject matter.

In FIG. 4, the LED 30 is formed as a so-called shell-type LED without using the lead frames 11 and 12 of the LED 10 embodiment shown in FIG. 2. This LED 30 includes a pair of lead frames 31 and 32, a blue LED chip 14, a wavelength conversion layer 15, and a resin mold portion 33. The one lead frame 31 has a cavity 31a formed on the upper end thereof. The blue LED chip 14 is positioned at the bottom face of the cavity 31a. The wavelength conversion layer 15 is formed inside the cavity 31a by filling a material in the cavity 31a to comprise the layer. The resin molded member 33 is formed so as to enclose both upper ends of the lead frames 31 and 32.

For this case, the upper electrode of the blue LED chip 14 is electrically connected by a bonding wire 32a to the upper end of the other lead frame 32. In addition, the wavelength conversion layer 15 formed inside the cavity 31a is composed of a first wavelength conversion layer 16 and a second wavelength conversion layer 17 in a manner similar to that of the LED 10 of FIG. 2. The method for forming the wavelength conversion layer 15 is also similar to that described with respect to LED 10 as well.

In particular, as shown with respect to the LED 10 shown in FIG. 2, when forming the wavelength conversion layer 15 to create the LED 30, initially, the first material for the first wavelength conversion layer 16 is applied and heated to be hardened onto the blue LED chip 14. Thereafter, the second material for the second wavelength conversion layer 17 is filled and heated to be hardened inside the cavity 31a on top of the layer 16.

Because of this, the first wavelength conversion layer 16 (which has a high concentration of wavelength conversion material), is formed on the blue LED chip 14, making it possible to obtain an almost uniform excitation intensity for the wavelength conversion material when using the blue light from the blue LED chip 14. In addition, light emitting characteristics can be achieved that have substantially no uneven color on the whole.

Figure 5:
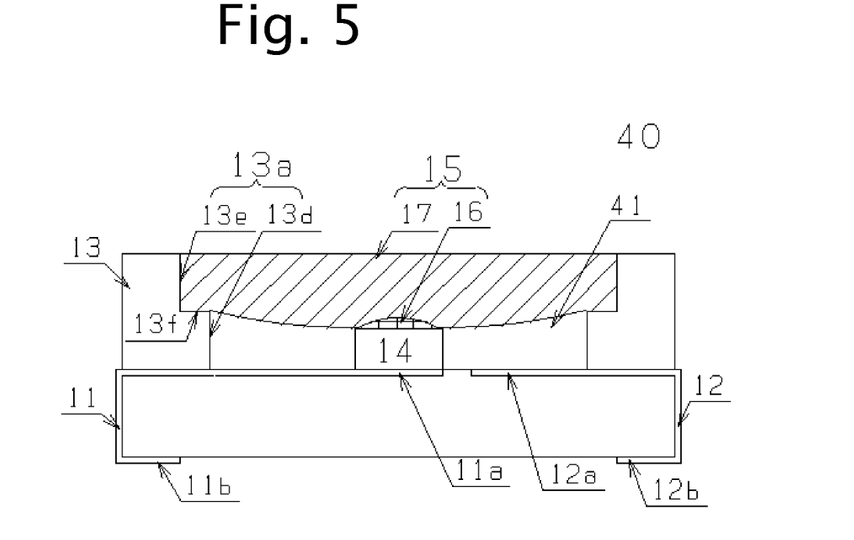
FIG. 5 is a schematic cross-sectional view showing the configuration of another embodiment of an LED manufactured by a manufacturing method according to principles of the disclosed subject matter.

FIG. 5 shows another embodiment of an LED used as a semiconductor light emitting device and made according to principles of the disclosed subject matter.

In FIG. 5, as compared to the LED 10 shown in FIG. 2, the LED 40 has a cavity 13a that includes a two-stage configuration composed of a lower cavity 13d and an upper cavity 13e that is larger than the lower cavity 13d. The wavelength conversion layer 15 is composed differently in that a transparent resin spacer 41 is included. This spacer can be filled inside the lower cavity 13d.

The lower cavity 13d is formed to have a cross-sectional area that is smaller in a horizontal direction as compared to the upper cavity 13e. The cavity 13a can also be provided with a step portion 13f that widens outward between the upper cavity 13e and the lower cavity 13d.

The transparent resin spacer 41 is formed of a material that can be identical to the optically transparent resin which is used for the first and second wavelength conversion layers 16 and 17, for example. The transparent resin spacer 41 is formed before forming the first and second wavelength conversion layers 16 and 17.

In other words, the transparent resin spacer 41, that does not contain a wavelength conversion material, is initially injected and filled inside the lower cavity 13d of the cavity 13a. The transparent resin spacer 41 is also injected after the blue LED chip 14 is mounted to the chip mounting portion 11a of the lead frame 11 which is exposed inside the cavity 13a of the housing 13.

The transparent resin spacer 41 can be filled up to the height of the step portion 13f between the lower cavity 13d and upper cavity 13e of the cavity 13a to an extent that slightly exposes at least a portion of the upper surface of the blue LED chip 14.

Next, a first material for the first wavelength conversion layer 16 is applied onto the blue LED chip 14 inside the cavity 13a and then heated to be hardened, thereby forming the first wavelength conversion layer 16. During this time, the viscosity of the material (thermosetting transparent resin) for the first wavelength conversion layer 16 is temporarily reduced by heating. Because of this, the wavelength conversion material precipitates by its own weight and deposits on the blue LED chip 14.

Next, a second material that is used for the second wavelength conversion layer 17 is filled into a substantial remainder of the entire upper cavity 13e over the top of both the first wavelength conversion layer 16 and the transparent resin spacer 41, and is then heated to be hardened.

Even if heat is generated due to energy loss during wavelength conversion of the wavelength conversion material while driving the LED 40, this heat will be efficiently transmitted to the blue LED chip 14 and the housing 13 for dissipation. Consequently, the light emitting efficiency is not reduced due to a temperature rise of the blue LED chip 14 by heat generated by the wavelength conversion material. This can provide a favorable light emitting efficiency.

Even further, the transparent resin spacer 41 is filled inside the lower cavity 13d of the cavity 31a in this case example. This results in the light emitted from the side of the blue LED chip 14 being incident to the second wavelength conversion layer 17 in an upwards direction via the transparent resin spacer 41.

Even if the wavelength conversion material deposits close to the bottom face of the second wavelength conversion layer 17 by naturally precipitating inside the layer 17, the light emitted from the side of the blue LED chip 14 will, in essence, be incident to the entire wavelength conversion material thereby improving the wavelength conversion efficiency. This makes it possible to reduce the amount of wavelength conversion material mixed inside the second wavelength conversion layer 17 in order to obtain a certain light quantity of wavelength-converted light.

According to the LED 40 with this type of configuration, initially, when forming the wavelength conversion layer 15, the transparent resin spacer 41 is filled and hardened inside the lower cavity 13d and then, in a manner similar to that used with respect to the LED 10 shown in FIG. 2, the first material for the first wavelength conversion layer 16 is applied and heated to be hardened onto the blue LED chip 14. Thereafter, the second material used for the second wavelength conversion layer 17 is filled and heated to be hardened inside the cavity 13a on top of both the layer 16 and the spacer 41.

Because of this, the first wavelength conversion layer 16 (which has a high concentration of wavelength conversion material), is formed on the blue LED chip 14, making it possible to obtain an almost uniform excitation intensity for the wavelength conversion material using the blue light from the blue LED chip 14. In addition, it is possible to obtain light emitting characteristics that have substantially no uneven color on the whole.

In addition, since the blue light from the blue LED chip 14 is, in essence, incident to and excites all particles of the wavelength conversion material contained in the second wavelength conversion layer 17, the excitation efficiency is improved.

Figure 6:
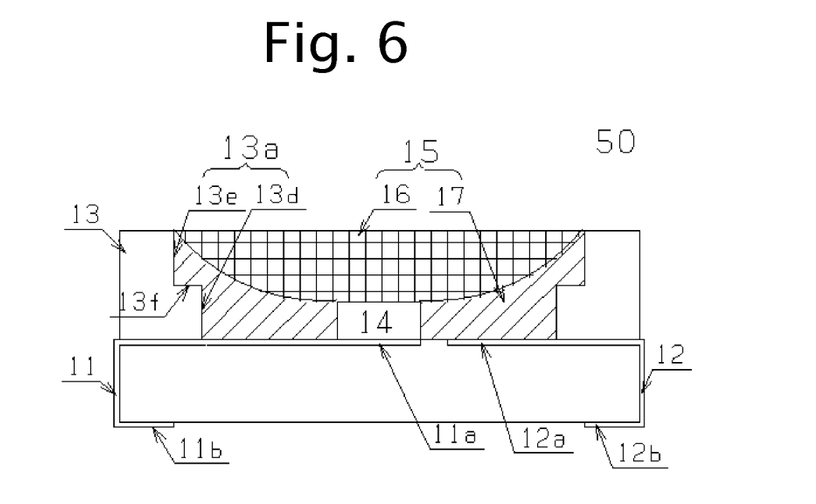
FIG. 6 is a schematic cross-sectional view showing the configuration of another embodiment of an LED manufactured by a manufacturing method according to principles of the disclosed subject matter.

FIG. 6 shows another embodiment of an LED used as a semiconductor light emitting device and made according to principles of the disclosed subject matter.

In FIG. 6, as compared to the LED 40 shown in FIG. 5, the LED 50 is composed differently in that the first wavelength conversion layer 16 is formed from the upper surface of the blue LED chip 14 and into substantially the entire upper side of the cavity 13a. In addition to this, the second material used for the second wavelength conversion layer 17 is filled inside the lower cavity 13d to slightly expose a portion of the upper surface of the blue LED chip 14. The second wavelength conversion layer 17 is formed into a bowl shape such that it slopes upwards towards its periphery.

Hereupon, the wavelength conversion layer 15 can be formed as described below. Namely, the second material used for the second wavelength conversion layer 17 (which has a comparatively low concentration of wavelength conversion material), is initially injected, filled, and heated to be hardened inside the lower cavity 13d of the cavity 13a after the blue LED chip 14 is mounted to the chip mounting portion 11a of the lead frame 11. The chip mounting portion 11a is exposed to the inside of the cavity 13a of the housing 13.

During this time, the second wavelength conversion layer 17 is formed to an extent that slightly exposes at least a portion of the upper surface of the blue LED chip 14.

Furthermore, the second wavelength conversion layer 17 is formed such that the surface of the layer slopes upward from the upper surface of the blue LED chip 14 towards the periphery. The outer peripheral edge of the surface of the layer can be positioned further up than the step portion 13f of the cavity 13a.

The bowl shape of the surface of the second wavelength conversion layer 17 is determined by the amount of upwards creeping on the side wall of the cavity 13a based on the surface tension of the material (thermosetting transparent resin) that constitutes the second wavelength conversion layer 17 and the surface shape that includes the step portion 13f of the cavity 13a.

Because of this, it is possible to control the amount of creep mentioned above as well as the bowl shape of the upper surface of the second wavelength conversion layer 17 by suitably selecting a shape for the step portion (namely, a surface shape that includes the step portion 13f) of the side wall of the cavity 13a, and by also selecting the materials. Furthermore, the shape of the step portion 13f also stabilizes the shape of the upper surface of the bowl shape of the second wavelength conversion layer 17 and determines the application quantity of material for the second wavelength conversion layer 17.

It is also possible to prevent the light from the side wall of the blue LED chip 14 from being directly incident to the first wavelength conversion layer 16 without passing through the second wavelength conversion layer 17. In this case, the step portion 13f of the cavity 13a may be positioned at a higher level than the upper surface of the blue LED chip 14. This makes it possible to control the amount of creep and to more easily form the bowl shape. This is possibly because the surface area in the vicinity of the step portion 13f increases faster than other portions of the cavity 13a near the area of the step portion 13f, resulting in an increase in the contact area with the second wavelength conversion layer 17. This is helpful because the bowl shape can be stably formed.

In place of the step portion 13f or in addition to the step portion 13f, the cavity surface in the vicinity thereof may be subject to a roughening treatment, such as provision of concavity and convexity, so as to increase the surface area.

Next, the first material used for the first wavelength conversion layer 16 is applied and heated to be hardened inside the cavity 13a (as well as at the upper surface of the blue LED chip 14). During this time, the viscosity of the material (thermosetting transparent resin) that constitutes the first wavelength conversion material 16 is temporarily reduced by heating. Because of this, the wavelength conversion material precipitates and deposits by its own weight.

In this example, the rear face of the first wavelength conversion layer 16 is formed in a bowl shape following the upper surface of the bowl shape of the second wavelength conversion layer 17. The thickness of the first wavelength conversion layer 16 gradually becomes thinner in a radial direction towards its periphery. In other words, a concentration gradient that decreases outwards in terms of quantity for the wavelength conversion material of the first wavelength conversion layer 16 is provided.

Accordingly, the wavelength conversion material of the first wavelength conversion layer 16 deposits uniformly in three dimensions at the bottom face of the first wavelength conversion layer 16.

Therefore, the blue light emitted from the blue LED chip 14 is wavelength converted by the wavelength conversion material and fluorescent yellow light is emitted, forming white light by mixing the blue light and this yellow light. When this white light is produced, it is possible to obtain light emitting characteristics substantially without uneven color because there is a uniform distribution of wavelength conversion material in three dimensions centered approximately on the upper surface of the blue LED chip 14.

As described above, the wavelength conversion material deposits on the upper surface and around the periphery of the blue LED chip 14 at a high concentration. Namely, the wavelength conversion material directly deposits on the upper surface of the blue LED chip 14 and at the bottom face of the periphery of the cavity 13*a*.

Because of this, even if heat is generated due to energy loss during wavelength conversion of the wavelength conversion material when the LED 50 is driven, this heat will be efficiently transmitted to the blue LED chip 14 and the housing 13 and then dissipated.

Consequently, the light emitting efficiency is not reduced due to temperature rise of the blue LED chip 14 by heat generated by the wavelength conversion material. This can provide a favorable light emitting efficiency.

According to the LED 50 with this type of configuration, initially, when forming the wavelength conversion layer 15, the second material used for the second wavelength conversion layer 17 is filled and hardened inside the lower cavity 13*b*. Then, the first material used for the first wavelength conversion layer 16 is applied onto the layer 17 and heated to be hardened.

Therefore, the first wavelength conversion layer 16 (which has a high concentration of wavelength conversion material), is formed such that it is substantially centered on the blue LED chip 14, making it possible to obtain an almost uniform excitation intensity for the wavelength conversion material using the blue light from the blue LED chip 14. In addition, light emitting characteristics can be achieved substantially without uneven color on the whole.

Figure 7:
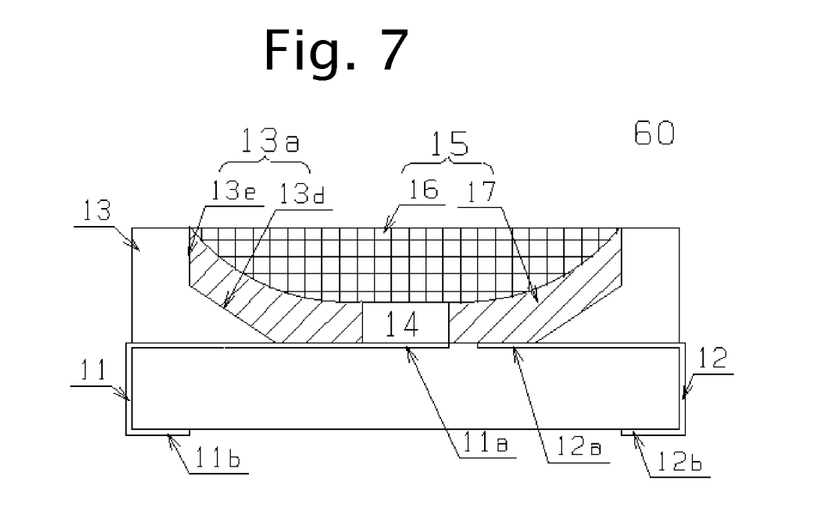
FIG. 7 is a schematic cross-sectional view showing the configuration of another embodiment of an LED manufactured by a manufacturing method according to principles of the disclosed subject matter.

FIG. 7 shows another embodiment of an LED used as a semiconductor light emitting device and made according to principles of the disclosed subject matter. In FIG. 7, as compared to the LED 50 shown in FIG. 6, the LED 60 is composed differently in that the side wall of the cavity 13*a* has an alternative shape. In this embodiment, the cavity 13*a* includes a lower cavity 13*d* that widens upwards from the bottom face so as to form an upwardly sloped side wall. The cavity 13 also includes an upper cavity 13*e* whose side wall is continued from the upper opening of the lower cavity 13*d* to extend vertically and perpendicularly to the bottom face or to slightly widen outwards.

Hereupon, the wavelength conversion layer 15 can be formed as described below. Namely, the second material used for the second wavelength conversion layer 17 (which has a comparatively low concentration of wavelength conversion material), is initially injected, filled, and heated to be hardened inside the lower cavity 13*d* of the cavity 13*a* after the blue LED chip 14 is mounted to the chip mounting portion 11*a* of the lead frame 11. The chip mounting portion 11*a* of the lead frame 11 is exposed to the inside of the cavity 13*a* of the housing 13.

During this time, the second wavelength conversion layer 17 is formed to an extent that slightly exposes at least a portion of the upper surface of the blue LED chip 14. Furthermore, the second wavelength conversion layer 17 is formed such that the surface of the layer slopes upward from the upper surface of the blue LED chip 14 towards the periphery. The outer peripheral edge of the surface of the layer 17 is positioned further up than the boundary of the side walls of the lower cavity 13*d* and the upper cavity 13*e* of the cavity 13*a*.

The bowl shape of the surface of the second wavelength conversion layer 17 is determined by the amount of upwards creeping on the side wall of the cavity 13*a* based on the surface tension of the layer 17 material (thermosetting transparent resin) and the side wall shape of the cavity 13*a*. Because of this, it is possible to control the amount of creep mentioned above as well as the bowl shape of the upper surface of the second wavelength conversion layer 17 by suitably selecting both the side wall shape of the cavity 13*a* and the material. Furthermore, the side wall shape also stabilizes the shape of the upper surface of the bowl shape of the second wavelength conversion layer 17 and determines the application quantity.

It is also possible to prevent the light from the side wall of the blue LED chip 14 from being directly incident to the first wavelength conversion layer 16 without passing through the second wavelength conversion layer 17.

Next, the first material used for the first wavelength conversion layer 16 is applied and heated to be hardened inside the cavity 13*a* as well as on the upper surface of the blue LED chip 14. During this time, the viscosity of the material (thermosetting transparent resin) that constitutes the first wavelength conversion material 16 is temporarily reduced by heating. Because of this, the wavelength conversion material precipitates and deposits by its own weight.

In this example, the rear face of the first wavelength conversion layer 16 is formed in a bowl shape following the upper surface of the bowl shape of the second wavelength conversion layer 17. Therefore, the thickness gradually becomes thinner in a radial direction towards the periphery. In other words, a concentration gradient that causes the quantity of the wavelength conversion material contained inside the first wavelength conversion layer 16 to decrease peripherally is provided. Accordingly, the wavelength conversion material of the first wavelength conversion layer 16 deposits uniformly in three dimensions at the bottom face of the first wavelength conversion layer 16.

Therefore, the blue light emitted from the blue LED chip 14 is wavelength converted by the wavelength conversion material and fluorescent yellow light is emitted, forming white light by mixing the blue light and this yellow light. When this white light is produced, it is possible to obtain light emitting characteristics that have substantially no uneven color. A uniform distribution of the wavelength conversion material in three dimensions is substantially centered on the upper surface of the blue LED chip 14.

As described above, the wavelength conversion material deposits on the upper surface and around the periphery of the blue LED chip 14 in a high concentration. Namely, the wavelength conversion material directly deposits on the upper surface of the blue LED chip 14 and at the bottom face of the periphery of the cavity 13*a*. Because of this, even if heat is generated due to energy loss during wavelength conversion of the wavelength conversion material when the LED 60 is driven, this heat will be efficiently transmitted to the blue LED chip 14 and the housing 13 and then dissipated. Consequently, the light emitting efficiency is not reduced due to a temperature rise in the blue LED chip 14 caused by the heat generated by the wavelength conversion material. This can provide a favorable light emitting efficiency.

According to the LED 60 with this type of configuration, initially, when forming the wavelength conversion layer 15, the second material used for the second wavelength conversion layer 17 is filled and hardened inside the lower cavity 13*b* and then the first material used for the first wavelength conversion layer 16 is applied onto the layer 17 and heated to be hardened.

Therefore, the first wavelength conversion layer 16 (which has a high concentration of wavelength conversion material), is formed to be substantially centered on the blue LED chip 14, making it possible to obtain an almost uniform excitation intensity for the wavelength conversion material using the blue light from the blue LED chip 14. In addition, it is possible to obtain light emitting characteristics that have substantially no uneven color on the whole.

In this embodiment, the upper opening of the lower cavity 13*d* and the lower opening of the upper cavity 13*e* can be substantially the same in size. This makes it possible to prevent the wavelength-converted light from leaking from the outer periphery of the light emitting portion. In addition to this, the area of the light emitting portion can be reduced, thereby improving the light density as a whole.

Figure 8:
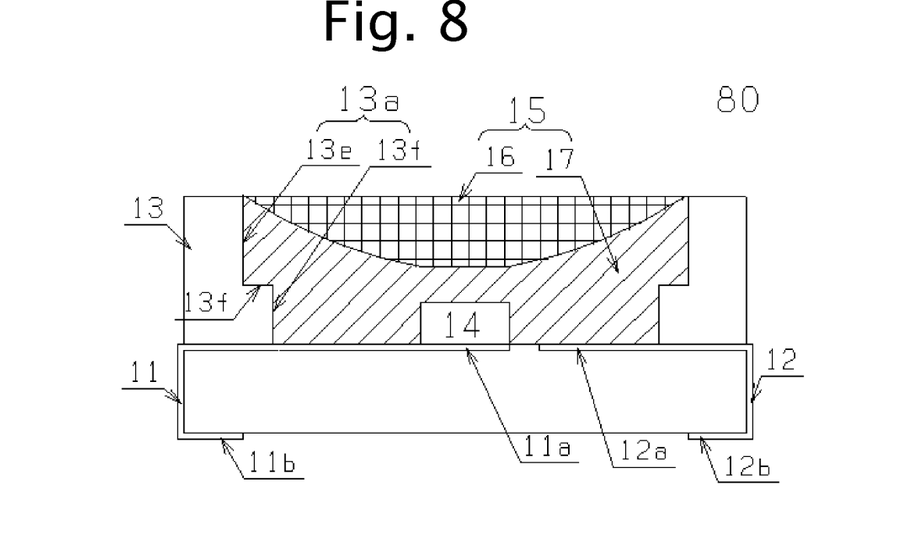
FIG. 8 is a schematic cross-sectional view showing the configuration of an LED as a comparative example, for examining the effect of the second wavelength conversion layer for the LEDs shown in FIG. 6 and FIG. 7.

FIG. 8 shows a modified example of the embodiment shown in FIG. 6. The same components as those in FIG. 6 are denoted by the same reference numerals. The LED 80 has a deeper lower cavity 13*d* of cavity 13*a* than that of the LED 50 according to the embodiment shown in FIG. 6. In addition to this, the LED 80 is different from the LED 50 in that the upper surface of the blue LED chip 14 that is placed on the bottom face of the lower cavity 13*d* is completely covered with the second wavelength conversion layer 17.

When the distance from the upper surface of the blue LED chip 14 to the upper surface of the second wavelength conversion layer 17 is set to be approximately three times or more the length of the blue LED chip 14 in the height direction, the temperature rise due to long term operation becomes larger than that according to the conventional example. This can be confirmed by thermography observation. It is conceivable that the generation of heat by the wavelength conversion material affected this result.

When a distance from the upper surface of the LED chip 14 to the upper surface of the second wavelength layer 17 was varied, it was found that the distance should be set to 1 times or less the height of the LED chip 14 for certain applications or benefits.

Furthermore, according to another embodiment of the disclosed subject matter, the cavity may have a light reflecting coating on the inner surface thereof. In the embodiment of FIG. 2, the side wall of the cavity 13*a* of the LED 10 is formed to widen upwards. However, the disclosed subject matter is not limited thereto, and the side wall of the cavity 13*a* may be perpendicular to the bottom face of the cavity 13*a* or may be formed in various other shapes and relationships with respect to the bottom face of the cavity 13*a*.

In the above embodiments, although the LEDs 40, 50, and 60 are provided with lead frames 11, 12 that are insertion molded in the housing 13 in a manner similar to that shown in the LED 10 of FIG. 2, the disclosed subject matter is not limited thereto. For example, the configuration of the LED as shown in FIG. 3 or FIG. 4 can also be used, as well as other configurations.

Furthermore, although the blue LED chip 14 is used as a light emitting element in the embodiments described above, the disclosed subject matter is not limited thereto. The LED chip can be configured to emit another color of light or a light emitting element with another configuration can also be used.

Although the wavelength conversion material contained in the first and second wavelength conversion layers 16 and 17 described above is arranged to wavelength-convert blue light to yellow light, the disclosed subject matter is not limited to this. A wavelength conversion material can be selected that wavelength-converts an emission color to a suitable color of light corresponding to the emission color of light for excitation from a light emitting element that contains an LED chip.

According to the above described embodiments, it is possible to provide a method for manufacturing a semiconductor light emitting device utilizing a simple configuration in which substantially no uneven color occurs in a mixed color of light consisting of and/or including excitation light from a light emitting element and wavelength-converted light produced by a wavelength conversion material. Depending on circumstance and desire, the resulting light emitting device should provide for efficient and favorable dissipation of the heat generated by energy loss during the wavelength conversion of the wavelength conversion material.

While there has been described what are at present considered to be some of the exemplary embodiments of the disclosed subject matter, it will be understood that various modifications may be made thereto, and it is intended that the appended claims cover all such modifications as fall within the true spirit and scope of the invention.

What is claimed is:

1. A method for manufacturing a semiconductor light emitting device, comprising:
   providing a housing having a cavity, a power feed line, and a light emitting element electrically connected to the power feed line; and
   forming a wavelength conversion layer in the cavity, the wavelength conversion layer including particles of a wavelength conversion material and further including a first wavelength conversion layer and a second wavelength conversion layer, wherein forming the wavelength conversion layer includes,
      applying and hardening a first material to form the first wavelength conversion layer directly on only a top surface of the light emitting element, and
      applying and hardening a second material in the cavity, thereby forming the second wavelength conversion layer over the first wavelength conversion layer.

2. The method for manufacturing a semiconductor light emitting device according to claim 1, wherein:
   forming the wavelength conversion layer includes injecting a transparent resin spacer, that does not contain a wavelength conversion material, inside the cavity to an extent that exposes at least a portion of an upper surface of the light emitting element, and hardening the transparent resin spacer.

3. The method for manufacturing a semiconductor light emitting device according to claim 1, wherein:
   providing the housing having the cavity includes providing the cavity that widens upwards.

4. The method for manufacturing a semiconductor light emitting device according to claim 2, wherein:
   providing the housing having the cavity includes providing the cavity that widens upwards.

5. The method for manufacturing a semiconductor light emitting device according to claim 2, wherein:
   providing the housing having the cavity includes providing the cavity that contains a lower cavity and an upper cavity, the upper cavity being wider than the lower cavity and positioned at a step portion that widens outward above the lower cavity; and injecting the transparent resin spacer includes providing an outer peripheral edge of the transparent resin spacer positioned at a substantially same height as the step portion.

6. The method for manufacturing a semiconductor light emitting device according to claim 4, wherein:

the cavity contains a lower cavity and an upper cavity, the upper cavity being wider than the lower cavity and positioned at a step portion that widens outward above the lower cavity; and an outer peripheral edge of the transparent resin spacer is positioned at a same height as the step portion.

7. The method for manufacturing a semiconductor light emitting device according to claim 1, wherein:

the first wavelength conversion layer has a higher concentration of wavelength conversion material than does the second wavelength conversion layer.

8. The method for manufacturing a semiconductor light emitting device according to claim 1, wherein:

the wavelength conversion material is a fluorescent material.

9. The method for manufacturing a semiconductor light emitting device according to claim 1, further comprising:

providing the power feed line with a lead frame; and insertion molding the power feed line within the housing so that the lead frame is exposed on a bottom face of the cavity.

10. The method for manufacturing a semiconductor light emitting device according to claim 1, further comprising:

insertion molding the power feed line within the housing, the power feed line including a lead frame that defines the cavity.

11. The method for manufacturing a semiconductor light emitting device according to claim 1, wherein:

the power feed line includes an electrode layer formed of a conductive thin film on a portion of at least one of a surface of the housing, a side wall of the cavity, and a bottom face of the cavity.

12. The method for manufacturing a semiconductor light emitting device according to claim 1, wherein providing the power feed line includes defining a cavity.

13. The method for manufacturing a semiconductor light emitting device according to claim 1, wherein providing the light emitting element includes providing the light emitting element with an optical axis along which the light emitting element is configured to emit light, and applying and hardening the first material to form the first wavelength conversion layer on the light emitting element includes applying and hardening the first material such that the first material intersects with the optical axis and such that, when the light emitting element is operated, light emitted from the light emitting element passes through the first material.

* * * * *